United States Patent
Song et al.

(10) Patent No.: US 10,474,192 B2
(45) Date of Patent: Nov. 12, 2019

(54) WEARABLE SMART DEVICE HAVING FLEXIBLE SEMICONDUCTOR PACKAGE MOUNTED ON A BAND

(71) Applicants: Young Hee Song, Seongnam-si (KR); Hyouk Lee, Cheonan-si (KR); Ki Hong Song, Seoul (KR); Jun Hee Jeong, Yongin-si (KR)

(72) Inventors: Young Hee Song, Seongnam-si (KR); Hyouk Lee, Cheonan-si (KR); Ki Hong Song, Seoul (KR); Jun Hee Jeong, Yongin-si (KR); Sung Sik Yun, Seoul (KR)

(73) Assignees: Young Hee Song, Seongnam-si, Gyeonggi-Do (KR); Hyouk Lee, Cheonan-si, Chungcheongnam-Do (KR); Ki Hong Song, Seoul (KR); Jun Hee Jeong, Youngin-si, Gyeonggi-Do (KR)

( * ) Notice: Subject to any disclaimer, the term of this patent is extended or adjusted under 35 U.S.C. 154(b) by 26 days.

(21) Appl. No.: 15/746,098

(22) PCT Filed: Aug. 1, 2016

(86) PCT No.: PCT/KR2016/008431
§ 371 (c)(1),
(2) Date: Jan. 19, 2018

(87) PCT Pub. No.: WO2017/023058
PCT Pub. Date: Feb. 9, 2017

(65) Prior Publication Data
US 2018/0210491 A1    Jul. 26, 2018

(30) Foreign Application Priority Data

Jul. 31, 2015 (KR) .................. 10-2015-0108806
Jul. 31, 2015 (KR) .................. 10-2015-0108810

(51) Int. Cl.
*G06F 1/16* (2006.01)
*H02J 7/02* (2016.01)
(Continued)

(52) U.S. Cl.
CPC ............ *G06F 1/163* (2013.01); *G04G 17/04* (2013.01); *G04G 17/06* (2013.01); *G04G 21/04* (2013.01);
(Continued)

(58) Field of Classification Search
CPC ........... G06F 1/163; H02J 50/10; G04G 17/06
See application file for complete search history.

(56) References Cited

U.S. PATENT DOCUMENTS

| 9,292,008 B1* | 3/2016 | Ahamed ............... G06F 1/163 |
| 2002/0181208 A1* | 12/2002 | Credelle ........... G06K 19/07749 361/737 |

(Continued)

FOREIGN PATENT DOCUMENTS

| JP | 2000-259577 | 9/2000 |
| KR | 10-2013-0085564 | 7/2013 |

(Continued)

OTHER PUBLICATIONS

International Search Report for International Application No. PCT/KR2016/008431, dated Feb. 7, 2017.

*Primary Examiner* — Hoa C Nguyen
*Assistant Examiner* — Christopher L Augustin
(74) *Attorney, Agent, or Firm* — Kile Park Reed & Houtteman PLLC

(57) ABSTRACT

A wearable smart device of the present invention comprises: a main body on which a basic module is mounted; a band on which at least one auxiliary module is mounted, which is selectively attached and detached to the main body made of a polymer material or a rubber material to be bent; a
(Continued)

connector electrically connecting the main body and the band; and a coupler physically connecting the main body and the band. According to a configuration of the present invention, the present invention is possible in realizing a high-capacity and high-performance smart device.

10 Claims, 13 Drawing Sheets

(51) Int. Cl.

| | | |
|---|---|---|
| *H02J 50/10* | (2016.01) | |
| *H01R 13/627* | (2006.01) | |
| *G04G 17/06* | (2006.01) | |
| *G04G 21/04* | (2013.01) | |
| *G06K 19/077* | (2006.01) | |
| *G04G 17/04* | (2006.01) | |
| *H01L 25/065* | (2006.01) | |
| *H04W 4/80* | (2018.01) | |
| *H01L 23/538* | (2006.01) | |
| *H01R 12/70* | (2011.01) | |
| *H01R 12/77* | (2011.01) | |
| *H02J 7/34* | (2006.01) | |
| *G04G 19/00* | (2006.01) | |

(52) U.S. Cl.
CPC .... *G06K 19/07773* (2013.01); *H01L 25/0657* (2013.01); *H01R 13/6273* (2013.01); *H02J 7/025* (2013.01); *H02J 50/10* (2016.02); *G04G 19/00* (2013.01); *H01L 23/5387* (2013.01); *H01L 2225/0651* (2013.01); *H01L 2225/06506* (2013.01); *H01L 2225/06513* (2013.01); *H01L 2225/06517* (2013.01); *H01L 2225/06562* (2013.01); *H01L 2225/06582* (2013.01); *H01R 12/7076* (2013.01); *H01R 12/777* (2013.01); *H02J 7/345* (2013.01); *H04W 4/80* (2018.02)

(56) References Cited

U.S. PATENT DOCUMENTS

| | | | | |
|---|---|---|---|---|
| 2007/0279852 A1* | 12/2007 | Daniel | ................. | A44C 5/0007 361/679.03 |
| 2014/0073486 A1* | 3/2014 | Ahmed | ............. | A61B 5/02405 482/9 |
| 2014/0179225 A1* | 6/2014 | Teng | ................. | H04M 1/72522 455/41.1 |
| 2014/0232328 A1* | 8/2014 | Pegg | ...................... | G04C 10/00 320/108 |
| 2015/0115870 A1* | 4/2015 | Vance | .................. | H02J 7/0042 320/101 |
| 2015/0130411 A1* | 5/2015 | Kim | ...................... | G04C 10/00 320/108 |
| 2015/0163921 A1* | 6/2015 | Oster | .................... | H05K 1/189 361/749 |
| 2015/0333302 A1* | 11/2015 | Johns | .................. | H01M 2/1066 429/127 |
| 2015/0349578 A1* | 12/2015 | Hu | ........................ | H02J 7/0042 320/108 |
| 2015/0372493 A1* | 12/2015 | Sankar | .................... | H02J 7/025 307/104 |
| 2016/0014245 A1* | 1/2016 | Zaitsev | .................. | G06F 1/163 455/557 |
| 2016/0020506 A1* | 1/2016 | Mahanfar | ............. | H01Q 1/273 343/718 |
| 2016/0226293 A1* | 8/2016 | Chen | ...................... | H02J 7/025 |
| 2016/0363957 A1* | 12/2016 | Stroetmann | ............. | G06F 1/163 |
| 2017/0005504 A1* | 1/2017 | Rho | ........................ | H02J 7/025 |
| 2017/0018248 A1* | 1/2017 | Na | ............................ | G06F 3/14 |
| 2017/0038797 A1* | 2/2017 | Ohsawa | ................. | G06F 1/163 |
| 2017/0374751 A1* | 12/2017 | Yang | ...................... | G06F 1/1615 |

FOREIGN PATENT DOCUMENTS

| | | |
|---|---|---|
| KR | 10-2014-0049999 | 4/2014 |
| KR | 10-2014-0109649 | 9/2014 |
| KR | 10-2015-0079440 | 7/2015 |

* cited by examiner

WEARABLE SMART DEVICE HAVING FLEXIBLE SEMICONDUCTOR PACKAGE MOUNTED ON A BAND

TECHNICAL FIELD

The present invention relates to a wearable smart device having a flexible semiconductor package mounted in a band for realizing a high-capacity and high-performance function, and more particularly, to a wearable smart device in which, in a smart watch or a smart computer system worn on a wrist for ensuring mobility, all functional modules are conventionally embedded in a main body so that space constraints follows and it is difficult to realize a multifunctional high capacity, however, each auxiliary module is designed to be able to exchange in a band by packing in units, and scalability is significantly improved by selectively arranging the module in a customized manner according to user's purpose for healthcare, fitness, learning, living, office work, games, or music.

BACKGROUND ART

Recently, as electronic products are being made in a small size, smart watches that can be worn at a place with good accessibility such as wrists or ends of shirt sleeves are being released.

Such smart watches have an advantage of providing mobility and convenience. However, in smart watches, a display area is small and a volume of the main body is so low that checking time, simple calls, or other data communication is possible, and there is a problem in that functions and capacity are considerably limited.

Meanwhile, a device required for a smart watch may include various electronic circuit elements. The electronic circuit elements may be integrated into a semiconductor substrate called a semiconductor chip or die. A semiconductor chip package is employed in electronic products such as computers, mobile devices, or data storages.

However, as the demand for mobility of an electronic product such as a smart watch increases, interest in a stacked package structure that can be bent or curved is increasing.

As interest in wearable electronics that can be worn on the face in the form of glasses or on the wrist in the form of a watch or bracelet requiring mobility has increased, flexibility characteristics such as bending or curving is required in the electronic products.

DISCLOSURE

Technical Problem

The present invention is directed to providing a wearable smart device having a semiconductor package structure in which functions are not restricted even when curved or bent according to a mobility requirement of a smart device.

The present invention is directed to providing a wearable smart device in which various modules having different functions according to a user's purpose can be mounted in selectively packaged in units.

The present invention is directed to providing a wearable smart device in which a smart device that requires high capacity, such as a memory module or a battery module, can compensate using wireless data communication or wireless charging technology.

Technical Solution

One aspect of the present invention provides a wearable smart device. The wearable smart device includes a main body in which a basic module is mounted, a band in which at least one auxiliary module is mounted and which is selectively attached to and detached from the main body and is formed of a polymer material or a rubber material to be bent, a connector configured to electrically connect the main body to the band, and a coupler configured to physically connect the main body to the band.

Another aspect of the present invention provides a wearable smart device. The wearable smart device includes a main body in which a basic module is mounted, a band electrically connected to the main body and bent, and auxiliary modules having respective functions and selectively mounted in the band in a prefabricated manner.

Still another aspect of the present invention provides a wearable smart device. The wearable smart device includes a main body in which a basic module is mounted, a band integrally connected to the main body and bent, and an auxiliary module formed with a flexible semiconductor package, embedded into the band, and electrically connected to the basic module, wherein the flexible semiconductor package includes a flexible printed circuit board (PCB) including a flexible wiring pattern, a semiconductor die stacked on the flexible PCB and connected to the flexible PCB using wire bonding or flip-chip bonding, and a flexible mold configured to protect the flexible semiconductor die.

Advantageous Effects

According to a configuration of the present invention, the following effects can be expected.

First, a conventional wearable band is manufactured by inserting all modules and memories into a main body, but there is a clear limit to realizing high multifunctional capacity due to spatial restrictions. However, in the present invention, modules are inserted into a band rather than a main body, more modules can be used by utilizing the modules in a detachable form that is suitable for user convenience, and the modules can be selected according to a user's purpose and characteristics, and thus the conventional functions can be expanded.

For example, in addition to a basic battery of a main body, an auxiliary battery is mounted in a band for battery extension so that a wearable band can be operated using the battery in the band even when the basic battery has been fully discharged. It is possible to charge through a wireless charger without a separate charging cable by inserting a wireless charging module into the band.

Second, as described above, when devices are manufactured using a flexible substrate instead of a rigid substrate and a packaging process is performed thereon, the flexible substrate can be wound around a supply roll and a wiring pattern can be formed on the flexible substrate while the substrate wound around the supply roll is being wound, such that mass production using a roll-to-roll process is possible.

MODES OF THE INVENTION

Figure 1A:
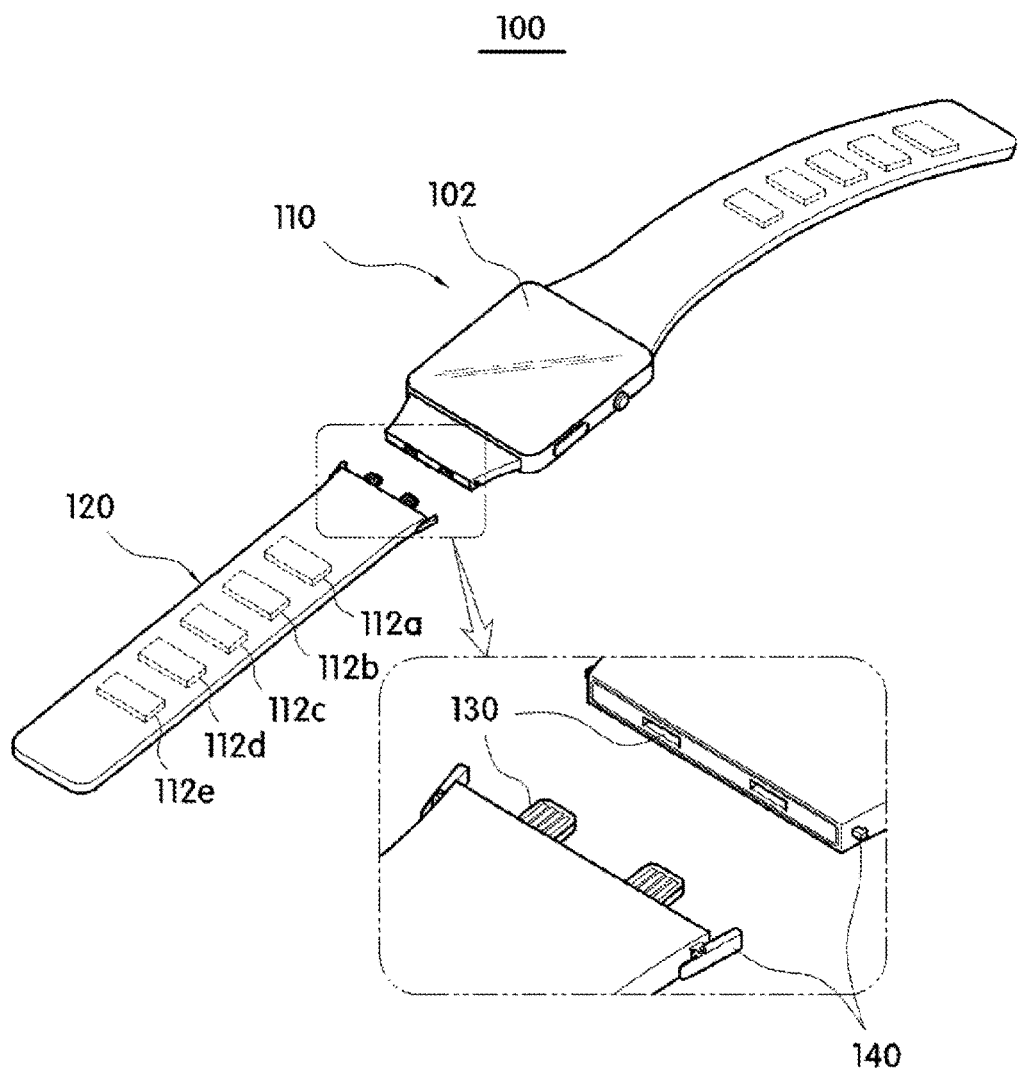
FIGS. 1A and 1B are perspective views each illustrating a configuration of a wearable smart device with a replaceable band according to the present invention.

Advantages and characteristics of the present invention and a method of achieving the advantages and characteristics will be clear by referring to exemplary embodiments described below in detail together with the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims. In the drawings, a size and a relative size of a layer or an area may be exaggerated for clarity of description. Like reference numerals indicate like components throughout the specification.

The exemplary embodiments of the invention will be described with reference to plan views and cross-sectional views, which are ideal exemplary views. Forms of the embodiments may be modified by the manufacturing technology and/or tolerance. Therefore, the embodiments of the invention are not intended to be limited to illustrated specific forms, and include modifications of forms generated according to the manufacturing processes. Therefore, areas illustrated in the drawings have overview properties, shapes of the areas are illustrated special forms of the areas of a device, and are not intended to limit the scope of the invention.

Hereinafter, preferred embodiments of a wearable smart device in which a flexible semiconductor package is mounted in a band according to the present invention having the above-described configuration will be described in detail with reference to the accompanying drawings.

In the present invention, a semiconductor package may be modularized and attached to and detached from a main body while being mounted in a band, a semiconductor package may be packaged in a rubber pack in units and selectively mounted in a band integrally connected to a main body, or a semiconductor package may be configured as an independent band so as to be separated from a main body.

In this case, when the semiconductor package is curved, tensile stress or compressive stress locally acts on a printed circuit board (PCB) and a semiconductor die, and a wiring pattern included in the PCB is damaged or the semiconductor die is separated, such that the semiconductor package needs to include a flexible PCB, one or more flexible semiconductor dies stacked on the flexible PCB and bonded to the flexible PCB by wire bonding or flip-chip bonding, and a flexible mold configured to protect the flexible semiconductor dies.

First Embodiment

Figure 1B:
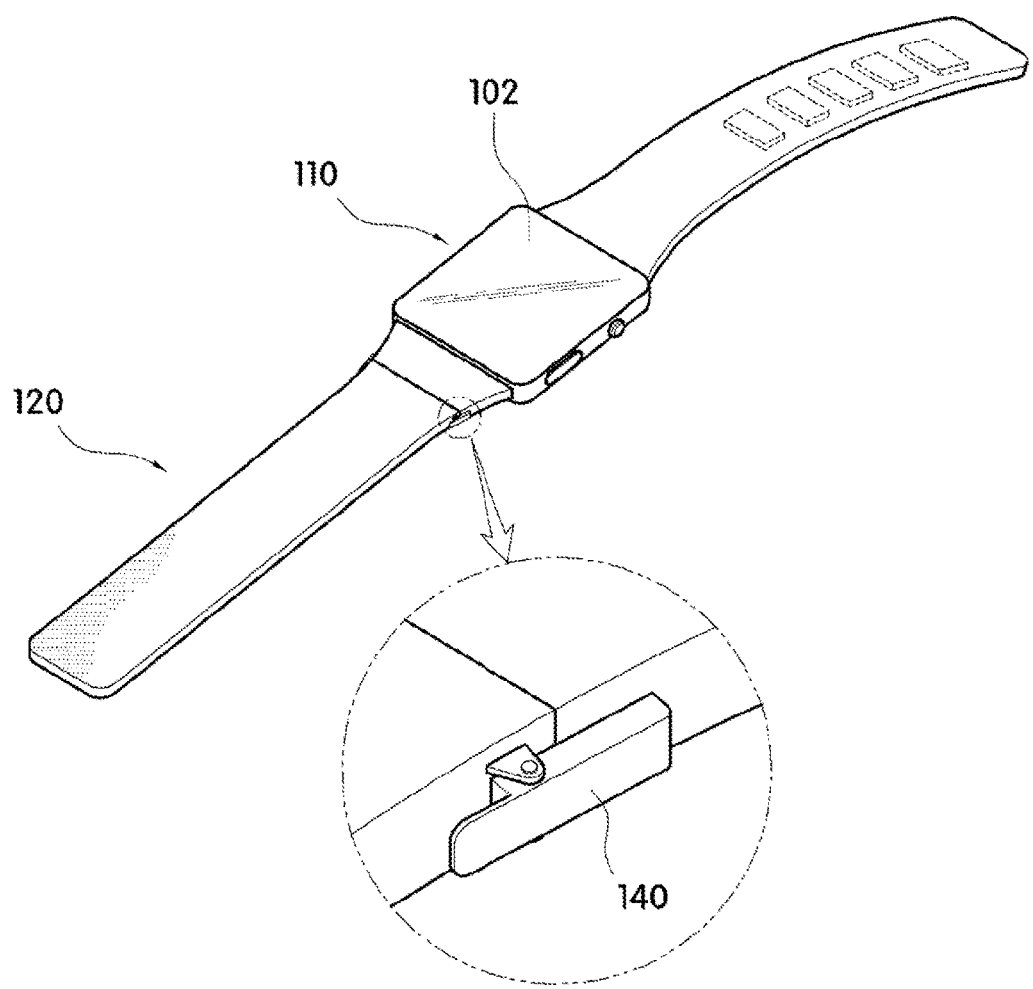

FIGS. 1A and 1B are conceptual views each illustrating a configuration of a wearable smart device with a replaceable band according to the present invention. FIG. 1A illustrates a configuration in which a main body and a band have been separated, and FIG. 1B illustrates a configuration in which the main body and the band are electrically connected and then physically connected.

Referring to FIGS. 1A and 1B, in a wearable smart device 100 with a replaceable band according to an embodiment of the present invention, a band 120 itself may be exchanged from a main body 110 and various functional modules may be mounted in the band 120. Therefore, the band 120 in which the modules having respective functions are mounted may be attached to and detached from the main body 110. That is, the band 120 having respective functions may be selectively coupled to the main body 110.

The wearable smart device 100 with a replaceable band may include the main body 110 in which a basic module 102 is mounted, a band 120, capable of being bent or stretchable, in which auxiliary modules 112a, 112b, 112c, 112d, and 112e are mounted and which is selectively attached to and detached from the main body 110, a connector 130 configured to electrically connect the main body 110 to the band 120, and a coupler 140 configured to physically connect the main body 110 to the band 120.

The basic module 102 includes a conventional semiconductor package which operates a display or other smart device. Therefore, the basic module 102 of the main body may include any module which enables a smart phone, a personal digital assistant (PDA), a handheld PC, a mobile phone, or other smart device having a similar function to operate.

Each of the auxiliary modules 112a to 112e cooperates with the basic module 102 to enhance a function of the basic module 102. For example, each of the auxiliary modules 112a to 112e may include a memory device or a non-memory device. Each of the auxiliary modules 112a to 112e may include a battery. Each of the auxiliary modules 112a to 112e may include a camera. Each of the auxiliary modules 112a to 112e may include a speaker. Each of the auxiliary modules 112a to 112e may include a light-emitting diode (LED) or a laser lighting.

In addition, each of the auxiliary modules 112a to 112e may further include an electrocardiogram sensor, a global positioning system (GPS), a micro secure digital (SD) slot, an auxiliary display for expanding the display of the basic module 102, or the like. For example, an electrocardiogram sensor may be used for biometric technology using, among biosignals, an electrocardiogram. To this end, an electrocardiogram measuring sensor formed with bio-electrodes may be provided in the band 120.

Figure 2:
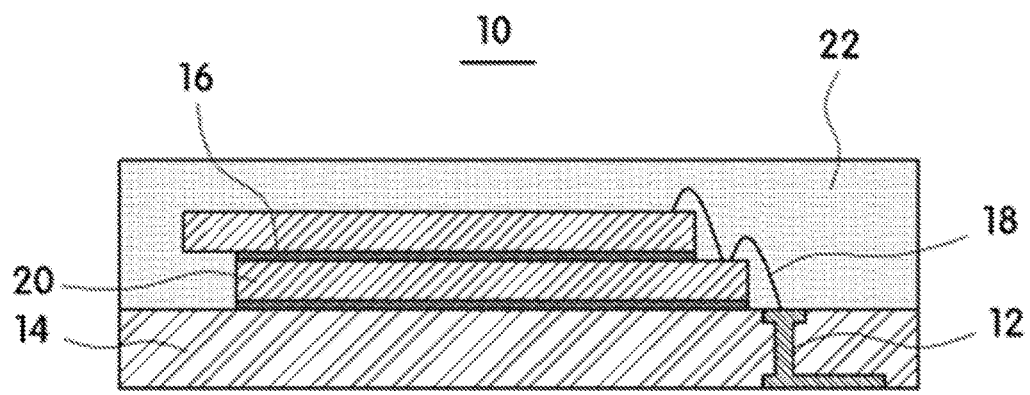
FIG. 2 is a cross-sectional view illustrating a configuration of a flexible semiconductor package according to the present invention.

FIG. 2 is a cross-sectional view illustrating a configuration of a flexible semiconductor package. Referring to the drawing, the auxiliary modules 112a to 112e may be formed with a flexible semiconductor package 10.

The flexible semiconductor package 10 includes a flexible PCB 14 including a flexible wiring pattern 12, one or more flexible semiconductor dies 20 stacked on the flexible PCB 14 using an adhesive member 16 and bonded to the flexible PCB 14 using a conductive member 18 by wire bonding or flip-chip bonding, and a flexible mold 22 configured to protect the flexible semiconductor dies 20.

The flexible PCB 14 may be bent or curved. The flexible PCB 14 may even be folded. To this end, the flexible PCB 14 may be formed of a polymer material. For example, the flexible PCB may be representatively formed of polyimide (PI), polyester, polyethylene naphthalate (PEN), Teflon, polyethylene terephthalate (PET), or other polymeric materials.

The flexible wiring pattern 12 electrically connected to the conductive member 18 is formed on the flexible PCB 14. The flexible wiring pattern 12 may form a curved conductive film including a flexible material such as copper (Cu), titanium (Ti), aluminum (Al), or a metal alloy.

The flexible wiring pattern 12 may include a conductive metal wiring formed through a deposition process using a lithography method and an etching process. For the sake of flexibility, the flexible wiring pattern 12 may include a conductive metal wiring formed by printing a conductive ink using a printing method.

Alternatively, when a portion of the substrate is removed by laser etching on a PI substrate and a wiring pattern is then formed by depositing a conductive metal, the flexible wiring pattern has a disadvantage in that material consumption is large and the process is complex due to repeated deposition and etching. Therefore, a metal wiring is first formed on a rigid substrate, a hardening polymer is coated thereon and cured, the rigid substrate is physically removed, and then the flexible substrate on which a wiring pattern is formed on the PI (flexible) substrate may be manufactured.

The flexible semiconductor die 20 may include a memory device or a logic device. The devices are integrated on a silicon substrate, but a thickness of the silicon substrate is not more than several tens of micrometers so that the silicon substrate may be curved. The flexible semiconductor die 20 may have a structure in which one or more chips are stacked using the adhesive member 16.

The adhesive member 16 may include a polymer material having excellent adhesion. A material having strong adhesion is required so that the flexible PCB 14 and the flexible semiconductor die 20 are not detached or separated and are stably coupled even when the flexible PCB 14 is curved or bent, in comparison to the rigid substrate.

The flexible mold 22 may be formed of a material to be curved or bent. For example, the flexible mold 22 may include a material capable of providing stress. The flexible mold 22 may include a polymer, rubber, or an elastomer. Alternatively, the flexible mold 22 may include PI.

For example, the flexible mold 22 should expand or contract even when the flexible semiconductor die 20 or the flexible semiconductor package 10 is arbitrarily curved or bent, and damage to the flexible mold 22 due to stress should be prevented even when stress occurs due to expansion and contraction. This is because when the flexible wiring pattern 12 formed on the flexible PCB 14 is cut or is separated from the flexible PCB 14 while the flexible semiconductor package 10 is bent or stretched, the flexible wiring pattern 12 can no longer function as a semiconductor device due to contact failure.

The band 120 is replaceable. The band 120 may be removed by disassembling the coupler 140 configured to connect the main body 110 to the band 120 and separating the connector 130 therefrom.

Figure 3:
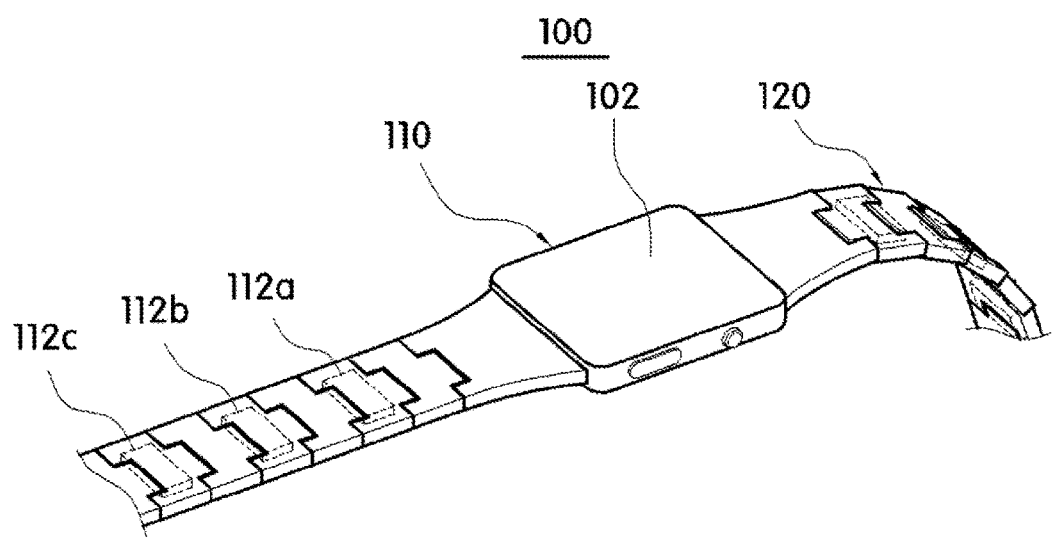
FIG. 3 is a perspective view illustrating flexible bands connected using a block type connection according to the present invention.

Referring to FIG. 3, in the band 120, a plurality of rigid bands may be coupled by a hinge pin, a hinge, or the like and may be curved. The rigid bands may be connected using a block type connection, and a bending band may be realized by designing each of the block bands to be rotatable by a certain angle. That is, the band 120 may be sufficiently curved or bent even though the band 120 is not flexible.

Referring again to FIG. 1A, the band 120 may exhibit elasticity as an integrated flexible band.

The curving or bending band 120 may be formed of a flexible polymer material or rubber material. The curving or bending band 120 may be formed, among polymers, of PI. When the flexible band is formed of such a material, even when the flexible band is curved, tensile stress or compressive stress is applied to the semiconductor package or the semiconductor die so that the semiconductor package or the semiconductor die is not damaged.

Figure 4:
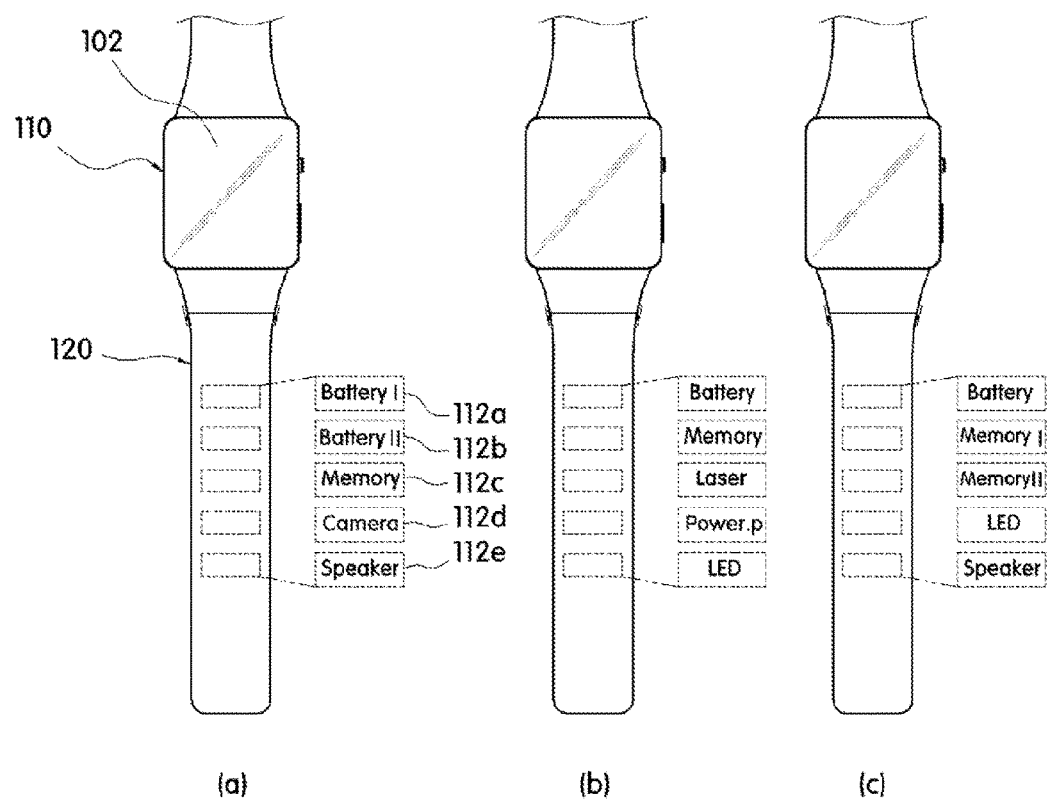
FIG. 4 is an exemplary view illustrating examples of a band for games, a band for office work, and a band for music according to the present invention.

FIG. 4 illustrates configurations of bands for various purposes according to the present invention. Referring to the drawing, each band 120 may be prepared for use according to the needs of a user. The bands 120 may be used for health care, fitness, learning, living, office work, games, music, and the like according to a purpose of the user.

As illustrated in FIG. 4A, a band for game may include a plurality of battery modules, a memory module, a camera module, and a speaker module in consideration of large battery consumption.

As illustrated in FIG. 4B, a band for office work may include a battery module, a memory module, a laser point module, a power point button module, and an LED module.

As illustrated in FIG. 4C, a band for music may include a plurality of memory modules because the band for music requires a large memory capacity, a battery module, an LED module, and a speaker module.

Referring again to FIGS. 1A and 1B, the connector 130 includes a first connector provided at one side of the band 120 and a second connector provided at one side of the main body 110, so that the band 120 is electrically connected to the main body 110. For example, the connector 130 may be divided into a 4-pin male type connector and a 4-pin female type connector.

The basic module 102 of the main body 110 and the auxiliary modules 112a to 112e of the band 120 may communicate with each other using the connector 130 in a wired manner. Although wired communication using the connector 130 is described as an example in the embodiment of the present invention, the basic module 102 and the auxiliary modules 112a to 112e may communicate with each other in a wireless manner, with or without omitting the connector.

In this case, a coupling depth of the connector may be increased for stable connection, and silicon or rubber molding processing may be performed on a coupling portion of the connector 130 for waterproofing.

The coupler 140 includes a first coupler provided at one side of the band 120 and a second coupler provided at one side of the main body, so that the band 120 is not arbitrarily separated from the main body 110. For example, the coupler 140 may fix a ring by hooking the ring to a hook. Alternatively, the coupler 140 may be designed to be attached and detached using a stopper or a spring. There are no restrictions on a coupling method.

Second Embodiment

In a wearable smart device according to another embodiment of the present invention, a band may be fixedly coupled to a main body. However, modules having various functions may be mounted so as to be exchanged from the band. Therefore, the modules having respective functions may be attached to and detached from the band.

Figure 5:
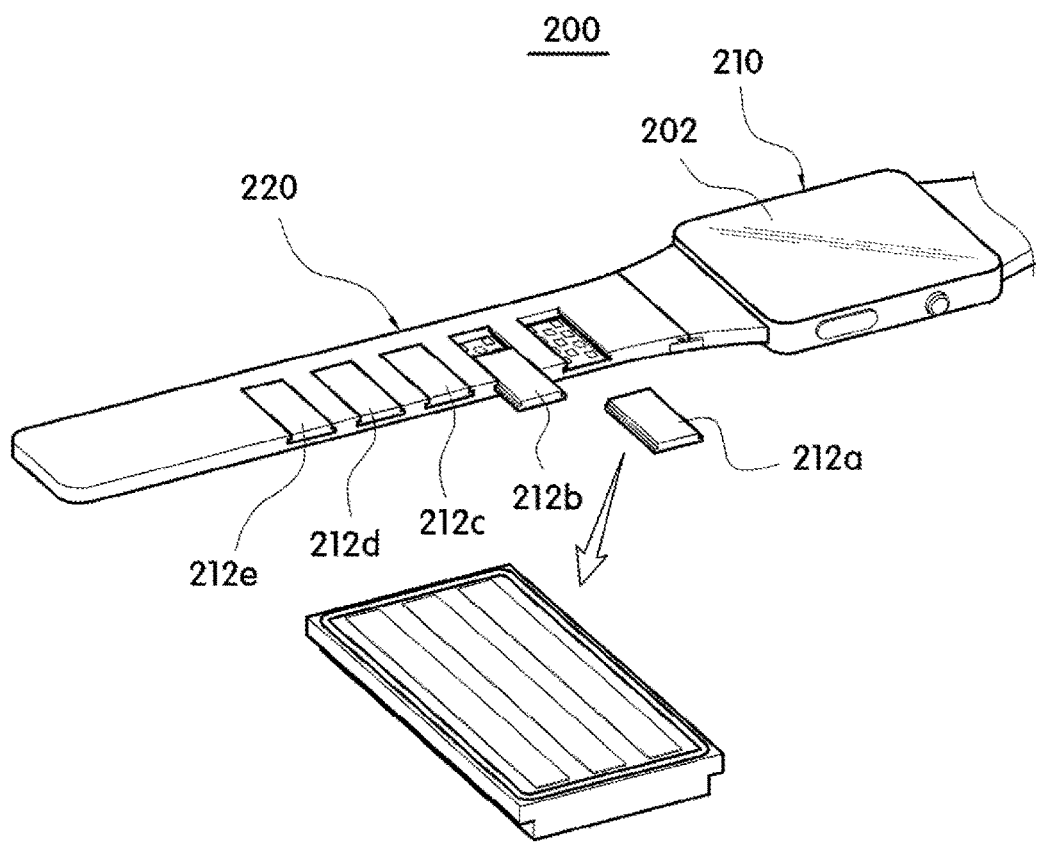
FIG. 5 is a perspective view illustrating a configuration of a wearable smart device with a replaceable module according to the present invention.

FIG. 5 illustrates a configuration of a wearable smart device with a replaceable module according to the present invention.

Referring to FIG. 5, a wearable smart device 200 with a replaceable module includes a main body 210 in which a basic module 202 is mounted, a bending band 220 electrically connected to the main body 210, and auxiliary modules 212a, 212b, 212c, 212d, and 212e having respective functions selectively mounted in the band 220.

The auxiliary modules 212a, 212b, 212c, 212d, and 212e are packaged in a polymer pack or a rubber pack (not illustrated) in units, and a mounting slot (not illustrated) in which the rubber pack is mounted is provided in the band. In this case, a depth of the mounting slot may be increased for stable mounting, and silicon or rubber molding processing may be performed to prevent water from penetrating a region around the mounting slot. Meanwhile, the mounting slot may include a plurality of connection terminals (not illustrated) configured to electrically connect the auxiliary modules 212a, 212b, 212c, 212d, and 212e to the basic module 202.

Here, since functions of the basic module 202 and the auxiliary modules 212a, 212b, 212c, 212d, and 212e are the same as those of the above-described embodiment, descriptions thereof will be omitted.

However, the rubber pack may be formed of a flexible polymer, rubber, or other elastomer. The rubber pack may be formed, among polymers, of PI. When the rubber pack is formed of such a material, even when the rubber pack is curved, tensile stress or compressive stress is applied to an embedded chip of the semiconductor package so that the embedded chip of the semiconductor package is not damaged.

Third Embodiment

In a wearable smart device according to a third embodiment of the present invention, an independent band is provided separately from a main device, and the independent band may enable wireless data transmission and wireless power transmission through short range communication with a main body of the main device.

The main device and the independent band may be provided on the same wrist so as to be separated from each other, or the main device may be provided on a left hand and the independent band be provided on a right hand, respectively.

Figure 6:
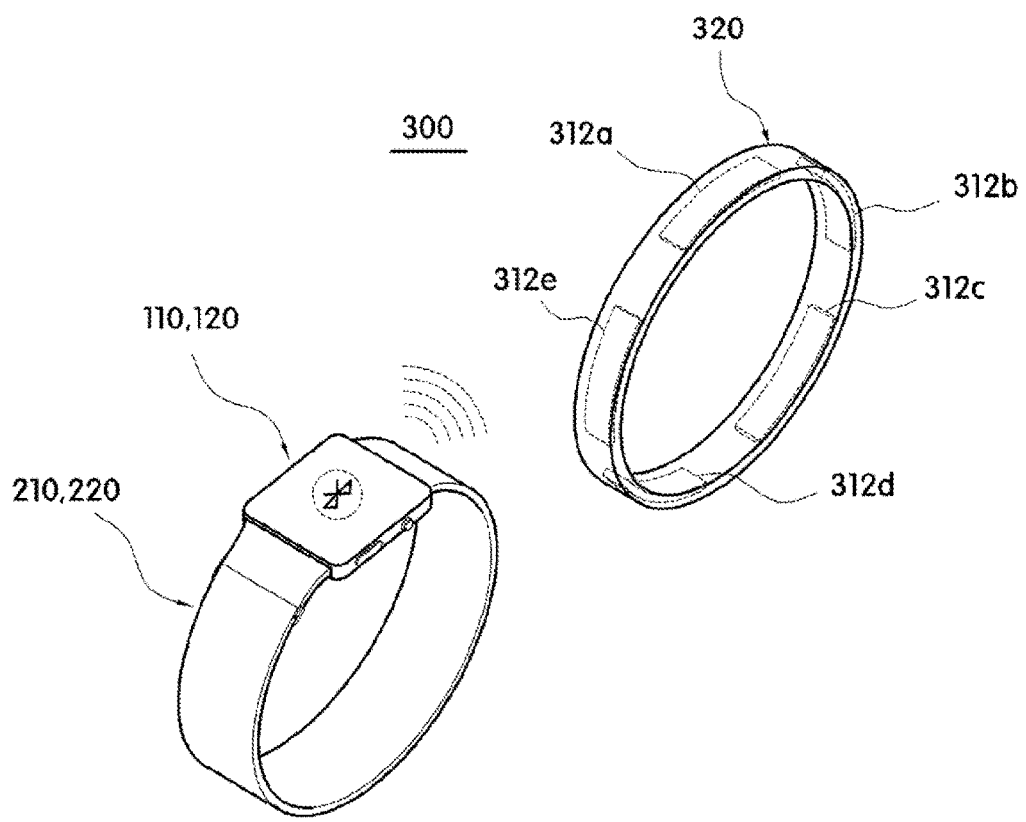
FIG. 6 is a perspective view illustrating a configuration of an independent-band wearable smart device according to the present invention.

FIG. 6 illustrates a configuration of an independent-band wearable smart device according to the present invention.

Referring to FIG. 6, an independent-band wearable smart device 300 includes main devices 100 and 200 including main bodies 110 and 120 and main bands 210 and 220, and an independent band 320 capable of enabling wireless data transmission through short range communication with the main devices 100 and 200 and charging a battery through wireless power transmission.

The independent band 320 includes independent modules 312a, 312b, 312c, 312d, and 312e. The independent band 320 may be a flexible, shrinkable, and closed ring type. The independent band 320 may be made of a PI material as described above.

To this end, the independent modules 312a to 312e of the independent band 320 may include a Bluetooth module, an infrared communication module, a Zigbee module, and the like, which enable wireless communication because the modules have various communication functions such as communication via network, specifically short range wireless communication, and thus may communicate with the basic modules 102 and 202 of the main bodies 110 and 120 having a wireless communication module or the auxiliary modules 112a to 112e in real-time. Alternatively, the independent modules 312a to 312e of the independent band 320 may wirelessly transmit power.

Data transmission and power transmission with the main devices 100 and 200 may be performed using the independent band 320 using wireless power consortium (WPC) technology and near field communication (NFC) technology. For example, an NFC coil may be provided in each of the modules for short range communication to transmit and receive data, and a WPC coil may be provided in each of the modules for wireless power transmission for wireless charging.

Specifically, in the present invention, when a WPC wireless charging module is mounted in any one of the auxiliary modules 112a and 212a or the independent module 312a, it is possible to charge through a wireless charger without a separate charging cable.

Fourth Embodiment

Although not illustrated in the drawings, an integrated-band wearable smart device of the present invention may be integrally formed with a main body to ensure water-tightness or waterproofness without band replacement.

An integrated-band or fixed-band wearable smart device may include a main body in which a basic module is mounted, a flexible band integrally connected to the main body, and an auxiliary module which is embedded in the band and electrically connected to the basic module.

As described above, the flexible band may be integrally connected to the main body and electrically connected to the main body through a connector, but may be permanently connected to the main body without detachment.

Fifth Embodiment

Figure 7:
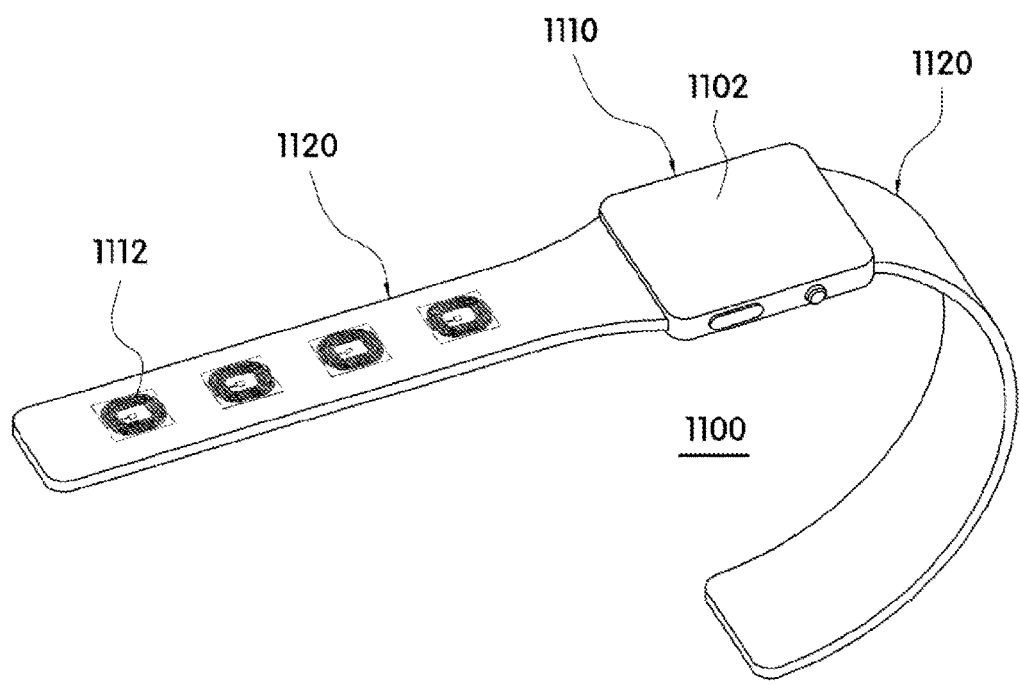
FIG. 7 is a perspective view illustrating a configuration of a fixed-band wearable smart watch according to the present invention.

Referring to FIG. 7, a wearable smart watch 1100 according to an embodiment of the present invention includes a main body 1110 in which a basic module 1102 is mounted, and a bendable and flexible band 1120. A battery 1112 which supplies power to the basic module 1102 is mounted in the band 1120. Accordingly, the battery 1112 is flexible along with the band 1120.

The basic module 1102 includes a conventional semiconductor package which operates a display or other smart watch. Therefore, the basic module 1102 of the main body 1110 may include any module which enables a smart phone, a PDA, a handheld PC, a mobile phone, or other smart device having a similar function to operate.

WPC technology for wireless power transmission may be applied to the battery 1112. Since the smart watch 1100 is used while being worn on the wrist, water-tightness should be substantially ensured. A port into which a charging jack is inserted should be open in order to charge using a wired cable. However, the port inhibits waterproofness. Therefore, in the wearable smart watch 1100, the port is omitted for water-tightness and wireless charging is preferably realized.

Accordingly, the battery 1112 of the present invention includes a wireless charging reception module 1114 configured to receive an electromagnetic wave from a wireless charging transmission module (not illustrated), and includes a capacitor module 1116 configured to store electrical energy generated by the wireless charging reception module 1114.

In the present invention, the wireless charging reception module 1114 may be provided in the form of a chip on board (COB) package. For example, in a COB package 1010 of the present invention, an antenna tag 1014 is formed integrally in the form of COB. The COB package 1010 may be formed by stacking at least two layers of COB sheets in order to increase a dynamic frequency.

The COB package 1010 includes a flexible substrate 1016, an antenna tag 1014 formed above the flexible substrate 1016, and a protective member 1018 which is insulating and adhesive to protect the antenna tag 1014. The antenna tag 1014 may be an annular coil in the form of a circle or a square and may receive electromagnetic waves which are wirelessly output at a frequency of approximately 150 KHz from a wireless charging transmitter module (not illustrated) of a charger.

An integrated circuit (IC) chip 1012 may include a rectifier, a regulator, a modulator, a microprocessor controller unit (MCU), or the like for effective wireless charging. A bonding layer bonded to the capacitor module 1116 may be formed at one side of the antenna tag 1014.

The flexible substrate 1016 may be designed to be flexible so as to be curved or folded. To this end, the flexible substrate 1016 may be formed of a polymer material. For example, the flexible substrate 1016 may be formed of PI, PET, or other polymeric material.

The capacitor module 1116 may be a rechargeable secondary battery capable of repeatedly charging and discharging, and may include an electric double-layer capacitor (EDLC) made of carbon. However, in the present invention, in order to apply the capacitor to the band 1120 having a large surface area and a small thickness, an EDLC 1030 in which activated carbon electrodes are disposed with a separator interposed therebetween is preferably used. Further, the EDLC 1030 is advantageous in realizing the flexible band 1120.

The EDLC 1030 includes a pair of electrodes 1036 which is provided on the flexible substrate 1032 and disposed above and below an insulating separator 1034 interposed therebetween, an insulator 1038 which covers side surfaces of the electrodes 1036 and divides the capacitor into units, and a pair of conductive metal covers 1042 which performs a current collecting function and covers the top and bottom of the electrodes 1036 using a conductive binder.

Activated carbon electrodes into which an electrolytic solution is permeated may be used as the electrodes 1036. Ion permeable polypropylene or other porous materials may be used as the separator 1034. Glass having an excellent insulating property may be used as the insulator 1038. A flexible aluminum foil having an excellent current collecting property may be used as the metal covers 1042.

The flexible substrate 1032 may be designed to be flexible so as to be curved. A polymer film may be used as the flexible substrate 1032. PEN or PET is flexible and suitable for the flexible substrate 1032.

The flexible substrate 1016 of the COB package 1010 and the flexible substrate 1032 of the EDLC 1030 may be used in substantially the same way.

Figure 8A:
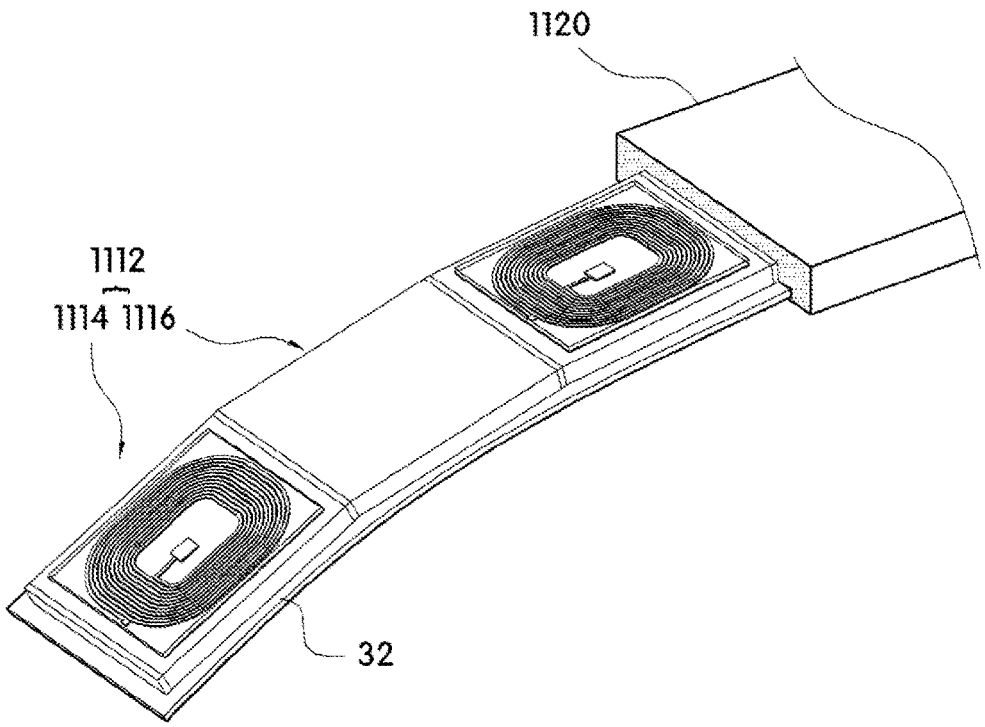
FIGS. 8A and 8B are a perspective view and a cross-sectional view according to an embodiment in which a chip on board (COB) package and an electric double-layer capacitor (EDLC) are vertically arranged in a wireless rechargeable battery according to the present invention.
Figure 8B:
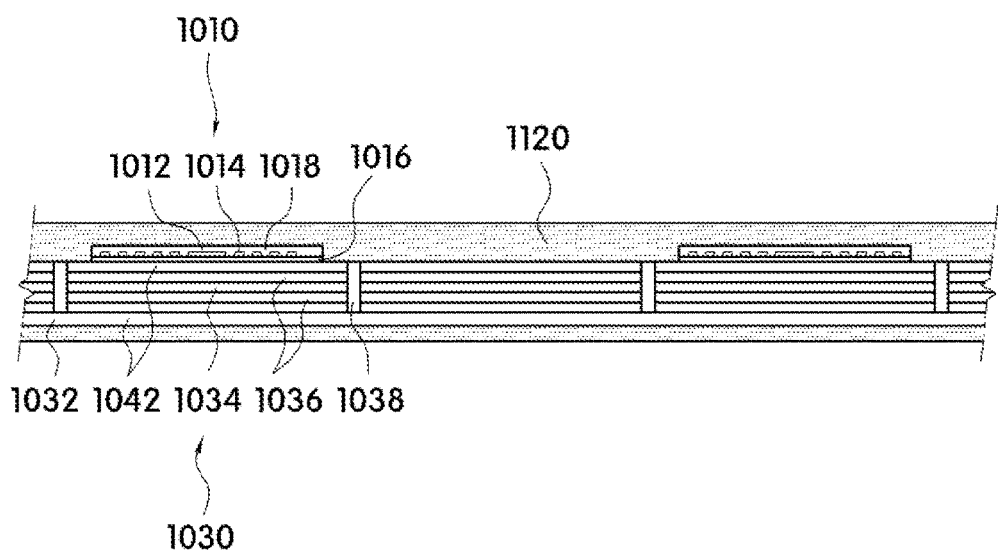
Figure 9A:
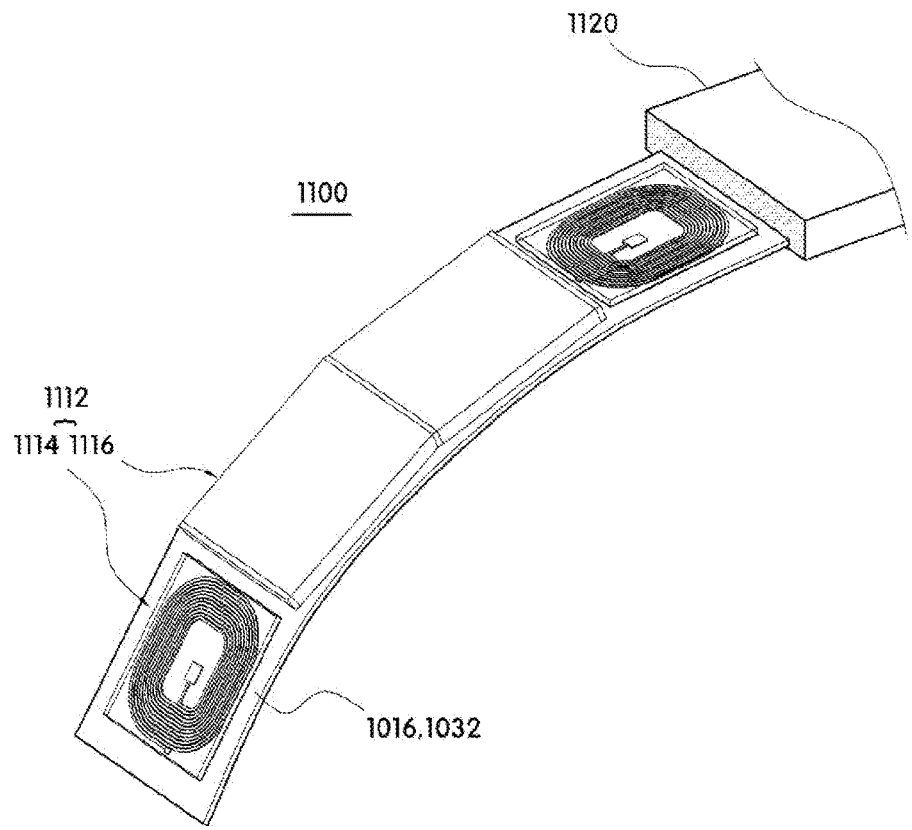
FIGS. 9A and 9B are a perspective view and a cross-sectional view according to another embodiment in which a COB package and an EDLC are horizontally arranged in a wireless rechargeable battery according to the present invention.
Figure 9B:
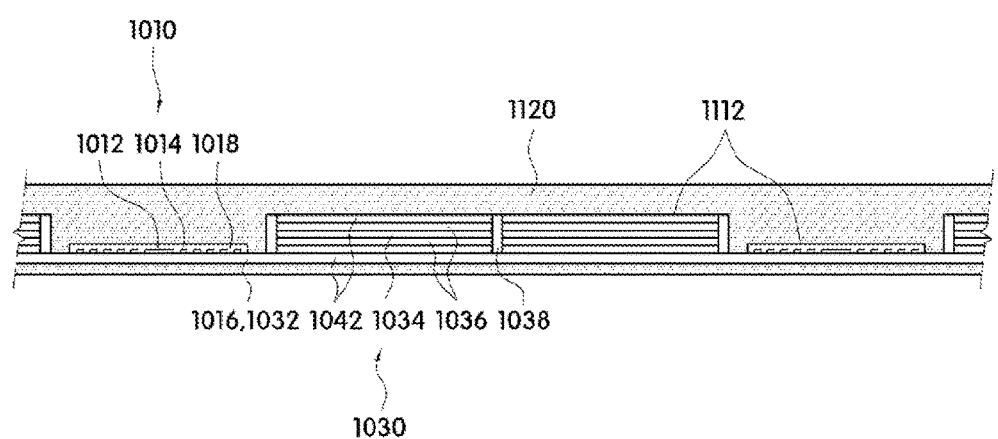

To this end, a structure in which the COB package 1010 and the EDLC 1030 are arranged at a right side and a left side as illustrated in FIGS. 9A and 9B is more advantageous than a structure in which the COB package 1010 and the EDLC 1030 are vertically arranged as illustrated in FIGS. 8A and 8B. That is, a rigid region and a flexible region are repeatedly arranged, so that the band 1120 may be naturally curved or bent with respect to the flexible region.

Figure 10:
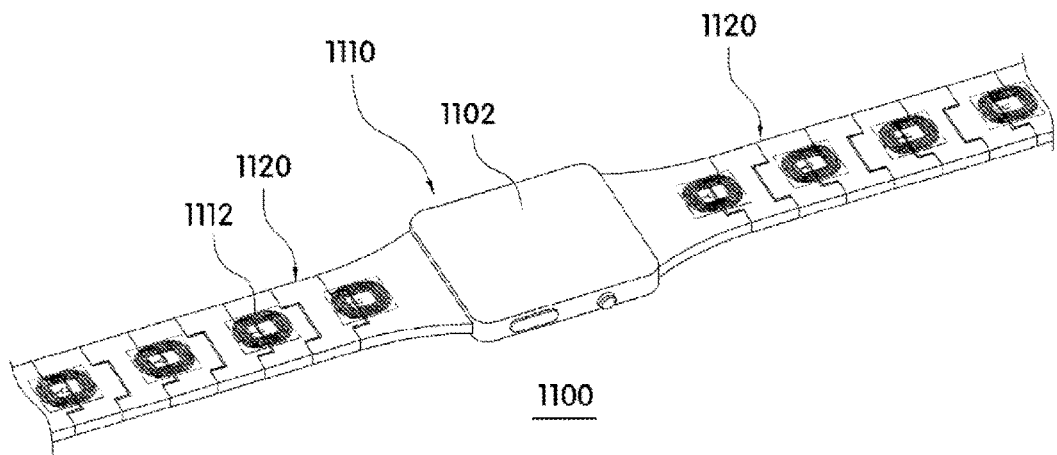
FIG. 10 is a perspective view illustrating a configuration of a band divided into a plurality of blocks according to the present invention.

Referring to FIG. 10, a plurality of rigid bands may be coupled by a hinge pin, a hinge, or the like so that the band 120 may be curved. Rigid bands are connected using a block type connection, and a bending band may be realized by designing each of the block bands to be rotatable by a certain angle. When a plurality of nodes is formed, the band 1120 may be sufficiently curved or bent even though the band 1120 is not flexible.

Figure 11:
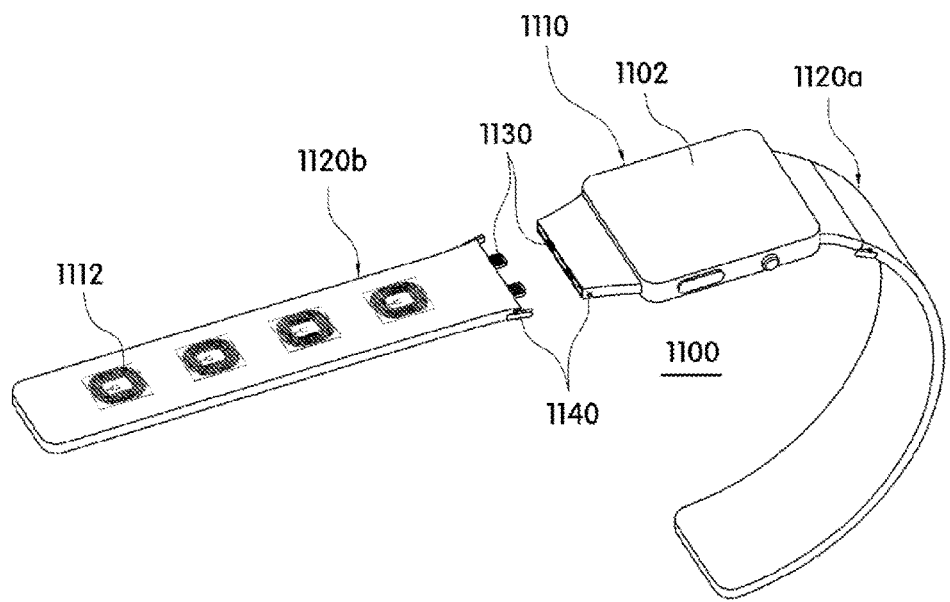
FIG. 11 is a perspective view illustrating a configuration of a smart watch including a replaceable band according to the present invention.

Referring to FIG. 11, the band 1120 described above is replaceable. The band 1120 may be exchanged from the main body 1110, and the plurality of batteries 1112 may be mounted in the band 1120, and the band 1120 in which the battery 1112 is mounted may be attached to and detached from the main body 1110.

To this end, the smart watch 1100 of the present invention may include, in addition to the main body 1110 and the band 1120, a connector 1130 configured to electrically connect the main body 1110 to the band 1120 and a coupler 1140 configured to physically connect the main body 1110 to the band 1120. Therefore, the band 1120 may be removed by disassembling the coupler 1140 configured to connect the main body 1110 to the band 1120 and by separating the connector 1130.

The connector 1130 may include a pair of protruding and depressed connectors so that the band 1120 is electrically connected to the main body 1110. The battery 1112 of the band 1120 may provide power to the basic module 1102 of the main body 1110 using the connector 1130. In this case, silicon or rubber molding processing may be performed on a coupling portion of the connector 1130 for waterproofing.

The coupler 1140 may be configured of a pair of hooks so that the band 1120 is not arbitrarily separated from the main body 1110.

Meanwhile, when a pair of left and right bands 1120 are fastened using buckles, bands 1120a and 1120b are fastened to both sides of the main body 1110. Therefore, when the band 1120a at one side and the main body 1110 are electrically connected through the connector 1130, since power is continuously supplied even when the band 1120b at the other side becomes separated from the main body 1110, the power may be maintained through the band 1120a at one side without rebooting while the battery 1112 is exchanged.

Referring again to FIG. 7, the band 1120 may exhibit elasticity as an integrated flexible band. The curved or folded band 1120 may be formed on a flexible polymer material or rubber material. The curved or folded band 1120 may be formed, among polymers, of PI. When the flexible band is formed of such a material, even when the flexible band is curved, tensile stress or compressive stress is applied to a semiconductor package or a semiconductor die so that the semiconductor package or the semiconductor die is not damaged.

Meanwhile, a spare battery band may be provided and may be designed so as to be exchanged with a used band after charging. Specifically, when the smart watch 1100 is used for a gaming purpose, a large amount of the battery 1112 is consumed. In this case, it is necessary to supply power through a separate independent band 1320.

According to another embodiment of the present invention, the independent band 1320 may be provided separately from the main smart watch 1100, and the independent band 1320 may be designed to be fastened to the main body 1110 or the band 1120 of the main smart watch 1100.

Figure 12:
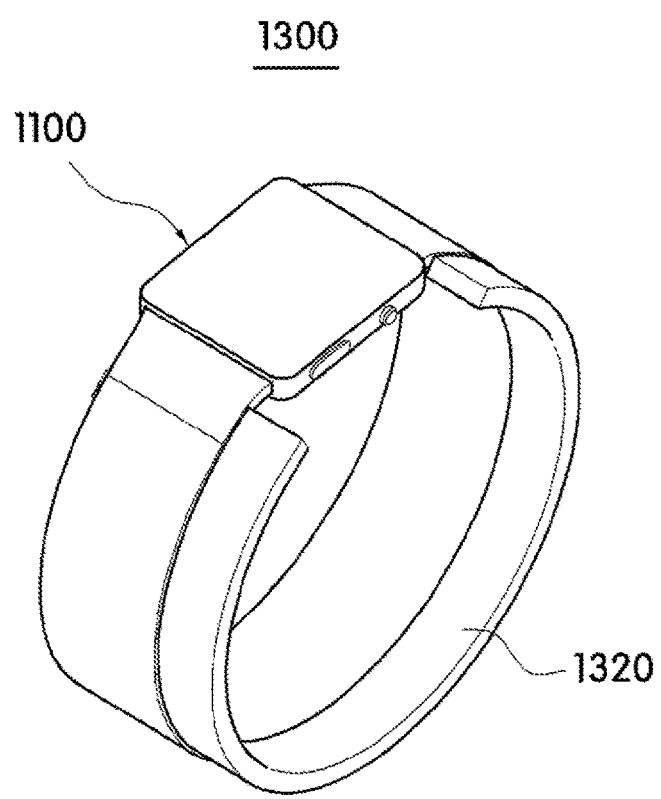
FIG. 12 is a perspective view illustrating a configuration of an independent band according to the present invention.

Referring to FIG. 12, an independent-band wearable smart device 1300 includes a main smart watch 1100 including a main body 1110 and a band 1120, and includes an independent band 1320 provided at one side of the smart watch 1100 and fastened to the main body 1110 or the band 1120.

The independent band 1320 includes one or more batteries 1112. The independent band 1320 may be a flexible, shrinkable, and closed ring (loop) type. The independent band 1320 may be made of a PI material as described above.

Figure 13:
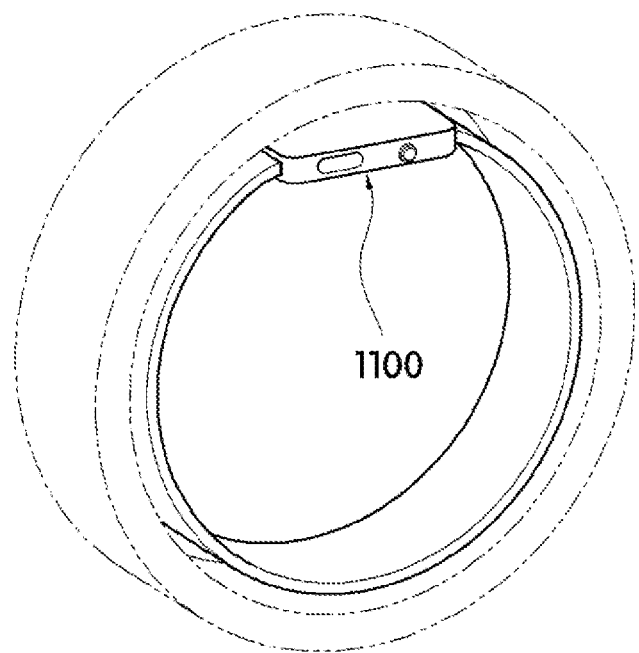
FIG. 13 is a view illustrating a state of use of wireless charging according to the present invention.

Referring to FIG. 13, the independent band 1320 may be charged using a charger P. When charging is completed, the independent band 1320 is fastened to the main smart watch 1100 as illustrated in FIG. 6 to apply power to the main smart watch 1100.

As described above, it can be seen that the present invention is based on the technical concept that, in realizing a multifunctional high-capacity wearable smart device by mounting a flexible semiconductor package in a band, a semiconductor package may be modularized and attached to a main body while being mounted in a band, a semiconductor package may be packaged in a rubber pack in units and selectively mounted in a band integrally connected to a main body, or a semiconductor package may be configured as an independent band so as to be separated from a main body. Many other modifications will be possible to those skilled in the art, within the scope of the basic technical idea of the present invention.

INDUSTRIAL APPLICABILITY

The smart device of the present invention may be used for healthcare, fitness, learning, living, office work, games, or music according to a user's purpose.

The invention claimed is:

1. A wearable smart device comprising:
a main body in which a basic module having a smart computer function is mounted; and
a band in which a battery is mounted so as to enable wireless charging through WPC wireless power transmission and so as to be bent or curved,
wherein the battery includes:
a plurality of wireless charging reception modules configured to receive an electromagnetic wave from a wireless charging transmission module; and
a capacitor module configured to store electric energy generated in the wireless charging reception modules,
wherein the plurality of wireless charging reception modules are spaced at intervals on the capacitor module so as to bend mainly at a part of the capacitor module on which the wireless charging reception modules are absent.

2. The wearable smart device of claim 1, wherein:
the wireless charging reception modules are arranged on the same substrate as the capacitor module so as to be alternately arranged at the same level;
bending or curving mainly occurs in the capacitor module having a smaller thickness than the wireless charging reception modules; and
bending or curving mainly occurs at a boundary between the wireless charging reception modules and the capacitor module.

3. The wearable smart device of claim 1, wherein the wireless charging reception modules include a chip on board (COB) package in which an antenna tag is stacked on a substrate in a COB manner and is covered by an insulating protective member.

4. The wearable smart device of claim 3, wherein the capacitor module includes an electric double-layer capacitor capable of repeatedly charging and discharging.

5. The wearable smart device of claim 3, wherein:
the substrate includes a flexible substrate made of a polymer material;
the antenna tag is a conductive film formed using flexible copper, titanium, or aluminum by a photolithography process or a printing process; and
the protective member includes an adhesive protective member made of a silicon material or a polymer material.

6. The wearable smart device of claim 4, wherein the electric double-layer capacitor includes:
a flexible substrate;
a pair of electrodes provided on the flexible substrate and arranged above and below the flexible substrate with an insulating separator interposed therebetween; and
a pair of conductive metal covers configured to perform a current collecting function and cover upper and lower portions of the electrodes using a conductive binder.

7. The wearable smart device of claim 6, wherein:
the flexible substrate is made of a flexible polyethylene terephthalate (PET);
the electrodes are flexible activated carbon electrodes into which an electrolytic solution is permeated;
the separator is made of a flexible polypropylene capable of permeating ions; and
the metal covers are flexible aluminum foils.

8. The wearable smart device of claim 1, wherein:
the band is replaceable in the main body;
the band is formed of a pair of bands at left and right sides with respect to the main body and the pair of bands are selectively attached to and detached from a wrist of a user by buckles; and
when the band is connected to the main body at one side, power of the main body is maintained even when the band at the other side becomes separated from the main body.

9. The wearable smart device of claim 8, further comprising:
a connector configured to electrically connect the main body to the band; and
a coupler configured to physically connect the main body to the band.

10. The wearable smart device of claim 1, further comprising an independent band selectively fastened to the band, wherein a plurality of batteries are mounted in the independent band.

* * * * *